United States Patent [19]

Turudic

[11] Patent Number: 4,985,675
[45] Date of Patent: Jan. 15, 1991

[54] MULTI-LAYER TOLERANCE CHECKER

[75] Inventor: Andy Turudic, Hillsborough, N.C.

[73] Assignee: Northern Telecom Limited, Montreal, Canada

[21] Appl. No.: 479,272

[22] Filed: Feb. 13, 1990

[51] Int. Cl.$^5$ .................................................. G01R 31/02
[52] U.S. Cl. ................................... 324/158 R; 324/538
[58] Field of Search .................. 324/158 R, 73.1, 537, 324/538; 174/266; 361/402, 412

[56] References Cited

U.S. PATENT DOCUMENTS

| | | | |
|---|---|---|---|
| 3,243,498 | 3/1966 | Allen et al. | 174/266 |
| 3,859,711 | 1/1975 | McKiddy | 324/538 |
| 4,432,037 | 2/1984 | Brabetz | 361/403 |
| 4,510,446 | 4/1985 | Braun et al. | 324/158 R |
| 4,894,606 | 1/1990 | Paur | 324/73.1 |

*Primary Examiner*—Ernest F. Karlsen
*Attorney, Agent, or Firm*—Foley & Lardner, Schwartz, Jeffery, Schwaab, Mack, Blumenthal & Evans

[57] ABSTRACT

Multi-layer printed circuit boards are sometimes connected to transmission paths which may be susceptible to electrical discharges associated with transient electrical events occurring along the transmission path. A method is provided for assuring that two respective layers of the printed circuit board are aligned within predetermined tolerances. Aligning respective layers within acceptable tolerances provides a means of assuring that predetermined distances between a ground layer and a power layer will be maintained, thereby ensuring that electrical arcing will not occur between the power and ground layer in the event of voltage spikes or current surges.

7 Claims, 3 Drawing Sheets

MULTI-LAYER TOLERANCE CHECKER

FILED OF THE INVENTION

This invention relates to circuit board testing, and more particularly, to methods of checking the alignment between respective layers on a printed circuit board.

BACKGROUND OF THE INVENTION

The telephone industry provides protection against transient events such as voltage spikes and current surges as appear from time to time on transmission lines. Such transient events may be summarily described as individually unpredictable bursts of electrical or electromagnetic energy. The effects of any such transient event occurrence upon a station set, a transmission line, or a central facility may range from a bit of noise on the communication line, to destruction of physical apparatus.

The advent of electrically fragile semiconductor based telecommunication transmission terminals and telephone exchange switching facilities, has served to amplify the severity of these effects.

In the past, it was typical for a printed circuit board to have one layer of insulating material sandwiched between two layers of conducting material. As the miniaturization of components became more prevalent, the demand for available surface area on printed circuit boards increased. Currently, printed circuit boards may have as many as ten layers of insulating and conducting material sandwiched together. Typically, openings or holes are drilled through these multi-layer printed circuit boards for receiving component leads. As printed circuit board material is removed via a drill bit, a cylindrical wall is formed to define an opening. This wall is plated with a conductive material for making contact with the conductive surface of some of the conductive layers. Since some openings having plated walls must not make contact with some of the conductive layers, it is necessary for selected conductive layers to have a non-conductive region electrically insulating them from the plated opening.

Also, it is necessary to provide inter-layer alignment ensuring that these non-conductive portions are approximately centered over holes so that no electrical contact is made with that specific layer. Typically, manufacturing processes can assure tolerances of approximately 10 thousandths of an inch.

Multi-layer printed circuit boards are particularly vulnerable to malfunction due to transient events such as voltage spikes resulting from lightning making contact with telephone lines. Typically, when an event such as this occurs, the surge of voltage provides a current which follows the telephone line occasionally terminating at the ground layer on the printed circuit board interfacing the line with other circuitry. The magnitude of the voltage associated with lightning may be of the order of 1500 volts. Often current may pass over or through an insulator if the distance it must traverse is very small or if the potential difference on either side of the insulator is large. It is found that if a potential difference of 1500 volts or more exists between two conductors separated by a gap of less than 20 thousandths of an inch, current may pass between the conductors and a carbon trace may be etched into the insulating material separating the two conductors. When a carbon trace is formed the printed circuit board is usually permanently damaged, since it is very difficult to repair these carbon traces.

It has been found that providing a minimum distance of 20 thousandths of an inch between ground and conductors of other layers is sufficient to avoid current arcing as a result of most transient events.

It is not uncommon for manufacturers of printed circuit boards to perform a post production test to determine if layers on the printed circuit board are aligned with respect to each other. Post production tests may be costly and time consuming using current methods. These tests involve applying high voltages to printed circuit boards and determining if arcing occurs. This may have destructive effects and is not a preferred method. Light tables and x-ray machines are commonly used to measure inter layer alignment but these tend to be costly and labour intensive.

It is accordingly an object of the invention to provide a method of testing boards after they are manufactured to ensure that the alignment between respective layers is within acceptable predetermined limits.

It is a further object of the invention to provide a method of testing boards after they are manufactured, which does not have any destructive effects.

SUMMARY OF THE INVENTION

In accordance with the invention there is provided a method of determining the presence of misaligned layers in a multi-layered printed circuit board, comprising the steps of:

(a) forming a plurality of test openings, each opening traversing a number of layers of the printed circuit board, at least one of which is a layer to be tested, said test openings having plated annular walls;

(b) placing on each layer to be tested, a non-conductive region surrounding each test opening, said region extending radially therefrom for a minimum specified distance; and (c) determining if there is an electrical path between a layer to be tested and said plated wall, so that a board with a layer which is misaligned by an amount exceeding said minimum specified distance can be detected.

BRIEF DESCRIPTION OF THE DRAWINGS

A particular embodiment of the invention is described with reference to the accompanying drawings, in which.

DESCRIPTION OF THE PREFERRED EMBODIMENT

Figure 1:
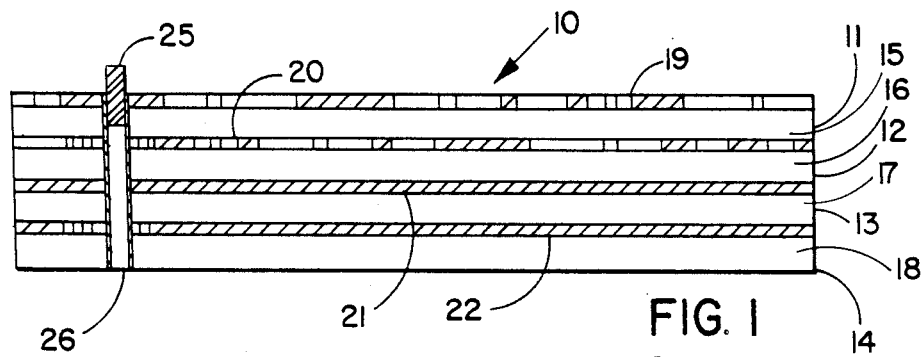
FIG. 1 is a sectional view of a prior art multi-layered printed circuit board.

A cross-section of a prior art multi-layered circuit board 10 is shown in FIG. 1. The board has a plurality of layers 11, 12, 13 and 14. Each layer is comprised of a substrate 15, 16, 17 and 18, respectively, made of suitable insulating material. Some layers have a predetermined pattern of conductive material disposed thereon, such as shown at reference numerals 19 and 20. Also, a multi-layered board is usually provided with a power and ground layer, 13 and 14. With these latter layers, the conductive material may be disposed across the entire surface of the layer, such as shown at reference numerals 21 and 22. The printed circuit board shown in FIG. 1 has a plated opening 26 for receiving a component lead 25, which is soldered in place. Solder may be applied via a wave soldering process or each lead may be manually soldered in place. A plurality of plated openings are common to multi-layered boards.

Figure 2:
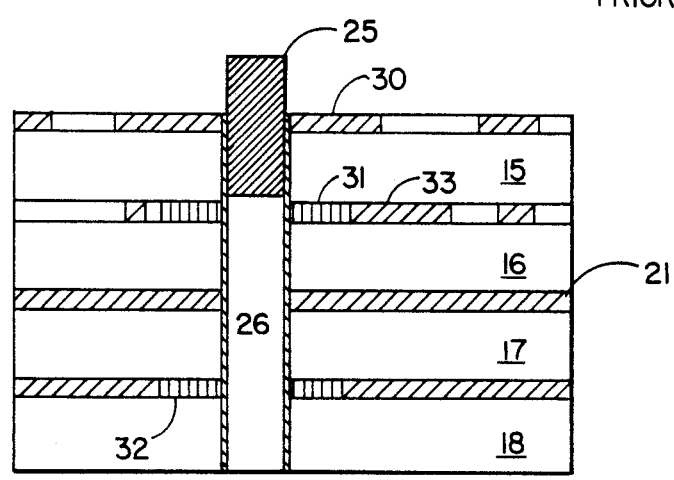
FIG. 2 is a close-up view of the board of FIG. 1.

FIG. 2 is a close-up view of the plated opening 26, shown in FIG. 1. As shown, the plated wall opening 26, component lead 25 and conductive portion 30 of layer 15 are all electrically connected to power layer 17 and in particular, to conductive surface 21. In this embodiment, layer 16 and ground layer 18 are electrically insulated from power layer 17, by placing non-conductive regions 31 and 32 around the plated wall opening 26. These non-conductive regions are made of suitable insulating material to isolate that portion of the pattern of conductive material, disposed on layers 16 and 18. The non-conductive region 32 at ground layer 18, extends radially from the plated wall to a predetermined distance therefrom, which is sufficient to prevent arcing therebetween. If a portion 33 of the conductive pattern of layer 16 is not at the same potential as power layer 17, then a non-conductive region 31 would be made to also extend radially to a distance from the plated wall opening 26 sufficient to prevent arcing.

Figure 3:
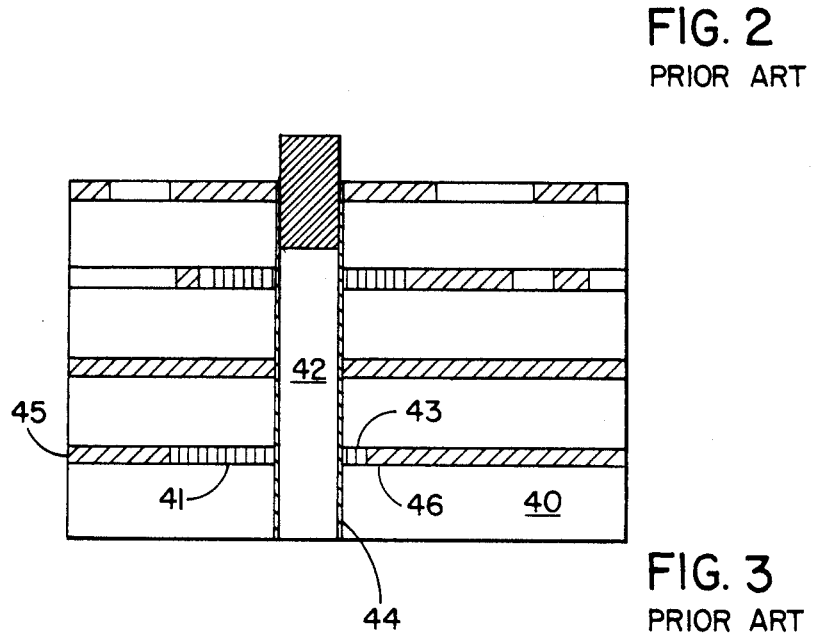
FIG. 3 is a close-up view of a multi-layered board with a misaligned layer.

FIG. 3 is a similar embodiment to that of FIG. 2, except that ground layer 40 is misaligned with respect to the other layers. The non-conductive region 41 surrounding the plated wall opening 42 has also shifted about the opening, leaving a narrow non-conductive region 43 adjacent plated wall 44. Since the plated wall 44 does not make electrical contact with the surface 45 of ground layer 40, the board might still pass the post assembly test. However, arcing is likely to occur between that portion 46 of the ground layer surface 45 and the plated wall 44 if these are subject to large potential differences.

Figure 4:
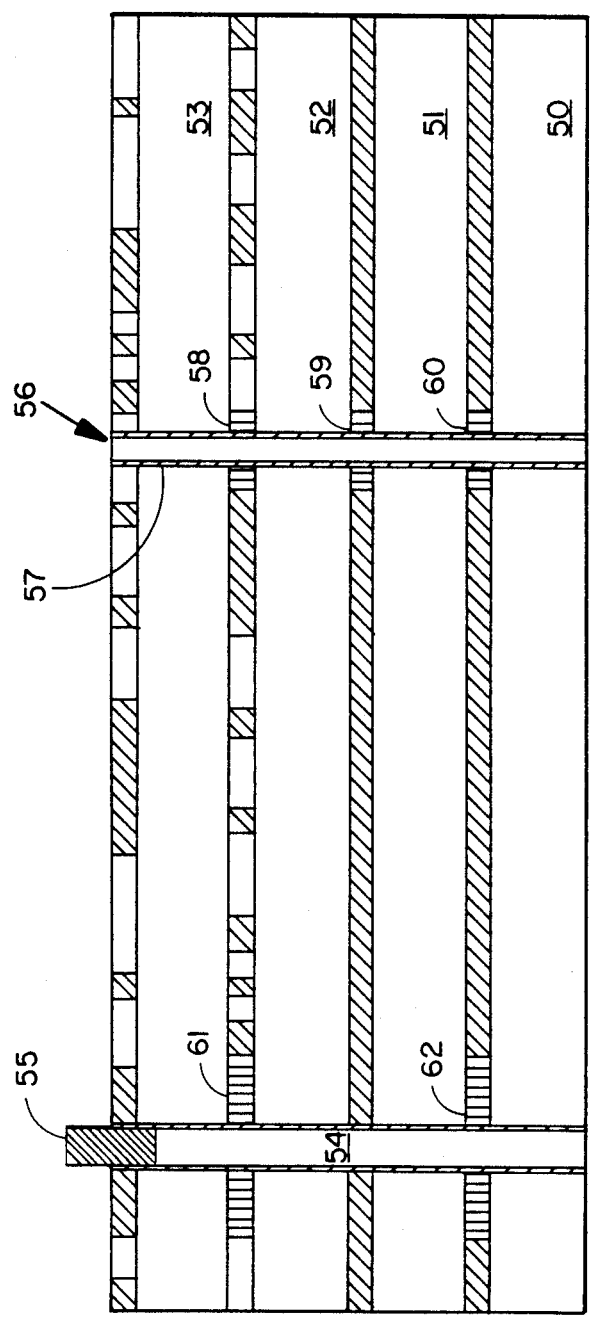
FIG. 4 is a sectional view of a multi-layered board according to the invention.

In FIG. 4, we have shown a sectional view of a multi-layered board according to a preferred embodiment of the invention. In this embodiment, the board is provided with a ground layer 50, a power layer 51 and a first and second layer with a predetermined pattern of conductive material, 52 and 53 respectively. A plated wall opening 54 and component lead 55 are also provided. However, in this embodiment, a test opening 56 is formed in the board. The test opening 56 has a plated wall 57, which is of a smaller diameter than the diameter of opening 54. Since the test opening is formed through a number of layers, non-conductive regions, 58 and 59 are placed around test opening 56, at each layer having a conductive surface for carrying signals other than earth ground. Otherwise, the plated wall might come in contact with these surfaces and affect the operation of the board. Similarly, a non-conductive region 60 is formed around the test opening at the ground layer 50.

In the preferred embodiment, the non-conductive regions 58, 59 and 60, surrounding test opening 56 have a radius $R_T$ and the non-conductive regions 61 and 62, surrounding plated wall opening 54 have a radius of $R_A + R_T$, where $R_A$ is greater than $R_T$. $R_A$ is the minimum radius required to prevent arcing across a predetermined non-conductive region and $R_T$ is the radius of the non-conductive region surrounding the test opening. Radius $R_T$ provides a craftsperson with an alignment gauge to test for the correct alignment of a layer once the board has been assembled. If a layer is misaligned by an amount greater than radius $R_T$, then it is likely that a non-conductive region surrounding a plated wall opening, is misaligned as well. Thus, it is also likely that a certain portion of the non-conductive region surrounding the opening has a radius less than $R_A$. If so, then arcing can occur across this region.

Figure 5:
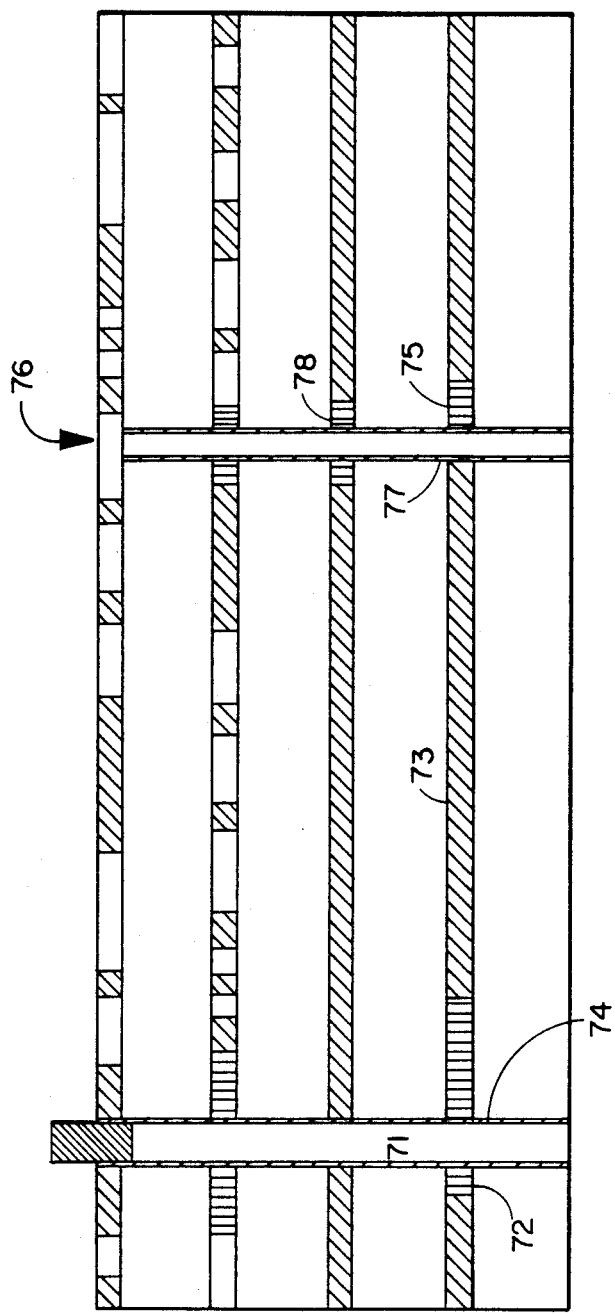
FIG. 5 is a close-up view of a multi-layered board with a misaligned layer, according to the invention.

In FIG. 5, the ground layer 70 is misaligned with respect to the opening 71, by an amount greater than radius $R_T$. The ground layer 70 and in particular non-conductive region 72 will therefore be susceptible to arcing. Ordinarily, the multi-layered board would pass the post-production test since surface 73 does not make electrical contact with the plated wall 74. However, as indicated above, the likelihood of arcing for this board has increased, since the distance between the conductive surface 73 of ground layer 70 and the plated wall 74 is less than $R_A$. Similarly, the misalignment of layer 70 has shifted the non-conductive region 75 about the plated wall test opening 76. Since the misalignment is greater than radius $R_T$, the plated wall 77 of test opening 76 makes contact with conductive surface 73 of ground layer 70. Accordingly, a craftsperson testing for continuity between test opening 76 and ground layer 70, will detect the misaligned layer.

As an example, if the minimum radius $R_A$ required to prevent arcing is 0.020 inches and the radius of a non-conductive region 78 surrounding the test opening 76 is 0.010 inches, then the non-conductive regions surrounding opening 71 should have a radius of 0.030 inches. Accordingly, even if the ground layer 70 is misaligned with respect to the test opening 76 by an amount less than 0.010 inches, the craftsperson will be assured that the distance $R_A + R_T$ around opening 71 is greater than 0.020 inches and thus within acceptable limits. That is, any non-conductive regions having a radius $R_A + R_T$ can be misaligned with respect to an opening by an amount which is not greater than $R_T$.

It was found that one test opening near each of the four corners of a printed circuit board and one test opening approximately at the center of the board provides an adequate test to determine if the ground layer is properly aligned within the tolerances mentioned.

Numerous modifications and variations may be made to the particular embodiment: of the invention described above without departing from the scope of the claims.

What is claimed is:

1. A method of determining alignment of layers in a multi-layered printed circuit board, and determining minimum tolerance to internal circuit board arcing, comprising the steps of:
    (a) forming a plurality of test openings, each of said plurality of test openings traversing a number of layers of the multi-layered printed circuit board, at least one of said number of layers being a layer to be tested, and each of said plurality of test openings having a first plated annular wall;
    (b) placing on each of said layers to be tested, a first non-conductive region surrounding each of said plurality of test openings, said first non-conductive region extending radially therefrom for a minimum specified distance corresponding to the minimum tolerance to internal circuit board arcing; and
    (c) determining an absence of an electrical path between an existing plated wall opening associated with each of said layers to be tested and each of said first plated annular walls, thereby determining the alignment of the multi-layered printed circuit board and the presence of minimum tolerance to internal circuit board arcing.

2. A method as defined in claim 1 wherein said plurality of test openings are vertically aligned such that said plated annular wall extends continuously through each opening, from one layer to the next.

3. A method as defined in claim 2 wherein each of said plurality of test openings are located near edges of the multi-layered printed circuit board.

4. A method as defined in claim 2 wherein said plurality of test openings are located near corners of the multi-layered printed circuit board.

5. A method as defined in claim 2 wherein at least one of said plurality of test openings is located near a center of the multi-layered printed circuit board.

6. A method as defined in claim 1, wherein each of said existing plated wall openings associated with each of said layers to be tested is adapted to receive component leads and electrically connect conductive traces on one of said layers to be tested to conductive traces on another of said layers to be tested, said plated wall openings surrounded by a second non-conductive region at a layer required to be isolated from said existing plated wall openings, wherein each of said first non-conductive regions are formed to extend radially therefrom for a distance $R_T$ and said second non-conductive regions are widened to extend radially therefrom for a distance $R_A + R_T$, wherein $R_A$ is a minimum radius required to prevent arcing across said second non-conductive region.

7. A method of determining alignment of layers in a multi-layered printed circuit board, and determining minimum tolerance to internal circuit board arcing, the multi-layered printed circuit board having a plurality of plated wall lead openings, adapted to receive component leads to electrically connect conductive traces of one layer of the multi-layered printed circuit board to conductive traces of another layer of the multi-layered printed circuit board, the multi-layer printed circuit board having an existing non-conductive region surrounding each of said plurality of plated wall lead openings at a layer required to be isolated therefrom, comprising the steps of:

(a) forming a plurality of test openings, each of said plurality of test openings traversing a number of layers of the multi-layered printed circuit board, at least one of said number of layers being a layer to be tested, each of said plurality of test openings having a first plated annular wall;

(b) placing on each of said layers to be tested, a first non-conductive region surrounding each of said plurality of test openings, said first non-conductive region extending radially therefrom for a distance $R_T$;

(c) widening said existing non-conductive region surrounding each of said plurality of plated wall lead openings to a new non-conductive region extending radially therefrom for a distance $R_A + R_T$, where $R_A$ is a minimum radius required to prevent arcing across said non-conductive region; and (d) determining the absence of an electrical path between each of said plated wall lead openings and each of said first plated annular walls thereby determining the alignment of the multi-layered printed circuit board and the presence of a layer which is misaligned by an amount exceeding $R_T$, and that the multi-layered printed circuit board has minimum tolerance to internal circuit board arcing.

* * * * *